US012793787B2

(12) United States Patent
Park

(10) Patent No.: US 12,793,787 B2
(45) Date of Patent: Nov. 10, 2026

(54) MEMORY DEVICE AND METHOD OF OPERATING THE SAME

(71) Applicant: SK hynix Inc., Icheon-si (KR)

(72) Inventor: Eun Young Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 99 days.

(21) Appl. No.: 18/901,238

(22) Filed: Sep. 30, 2024

(65) Prior Publication Data

US 2025/0308599 A1 Oct. 2, 2025

(30) Foreign Application Priority Data

Mar. 26, 2024 (KR) ........................ 10-2024-0041123

(51) Int. Cl.
*G11C 16/34* (2006.01)
*G11C 16/04* (2006.01)
*G11C 16/16* (2006.01)

(52) U.S. Cl.
CPC .......... *G11C 16/16* (2013.01); *G11C 16/0483* (2013.01); *G11C 16/3418* (2013.01)

(58) Field of Classification Search
CPC . G11C 16/16; G11C 16/0483; G11C 16/3418; G11C 16/08; G11C 16/32; G11C 16/14; G11C 16/30
USPC ........................................ 365/185.11, 185.24
See application file for complete search history.

(56) References Cited

U.S. PATENT DOCUMENTS

| | | | | |
|---|---|---|---|---|
| 9,223,514 B2 * | 12/2015 | Hyun | G11C 16/16 |
| 10,453,524 B2 * | 10/2019 | Kaminaga | G11C 16/0483 |
| 11,061,578 B2 * | 7/2021 | Cariello | G06F 3/0611 |
| 11,237,754 B2 * | 2/2022 | Guda | G06F 3/0683 |
| 2013/0124792 A1 * | 5/2013 | Melik-Martirosian | G11C 16/14 365/185.11 |
| 2014/0047167 A1 | 2/2014 | Kwak | |
| 2021/0173580 A1 * | 6/2021 | Guda | G06F 3/0652 |
| 2022/0336029 A1 * | 10/2022 | Zhao | G11C 16/0483 |

FOREIGN PATENT DOCUMENTS

| | | |
|---|---|---|
| KR | 1020190087072 A | 7/2019 |
| KR | 1020200139042 A | 12/2020 |

* cited by examiner

*Primary Examiner* — Michael T Tran
(74) *Attorney, Agent, or Firm* — WILLIAM PARK AND ASSOCIATES LTD.

(57) ABSTRACT

A memory device, and a method of operating the same, includes a memory block including a plurality of memory cells. The memory device also includes a peripheral circuit configured to perform an erase operation on the memory block by applying an erase voltage to a source line of the memory block, applying a word line voltage to word lines, and applying a select line voltage to a select line. The memory device further includes control logic configured to control the peripheral circuit to perform a suspend operation of suspending the erase operation in response to a suspend command and a resume operation of resuming the suspended erase operation. The control logic adjusts the level of the erase voltage, word line voltage, or select line voltage for an erase operation to be resumed during the resume operation based on the level of the erase voltage in the suspended erase operation.

28 Claims, 11 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2024-0041123 filed on Mar. 26, 2024, in the Korean Intellectual Property Office, the entire contents of which application is incorporated herein by reference.

BACKGROUND

1. Technical Field

Various embodiments of the present disclosure relate to an electronic device, and more particularly, to a memory device and a method of operating the memory device.

2. Related Art

Among semiconductor devices, memory devices are broadly classified as volatile memory devices or nonvolatile memory devices.

A nonvolatile memory device has a relatively low write and read speed, but it retains stored data even when its power supply is interrupted. Therefore, a nonvolatile memory device is used to store data to be retained regardless of whether power is supplied. Representative examples of a nonvolatile memory include read-only memory (ROM), mask ROM (MROM), programmable ROM (PROM), erasable programmable ROM (EPROM), electrically erasable programmable ROM (EEPROM), flash memory, phase-change random-access memory (PRAM), magnetic RAM (MRAM), resistive RAM (RRAM), ferroelectric RAM (FRAM), etc. Flash memory is classified as NOR type or NAND type.

Flash memory has the advantage of RAM in which data is freely programmable and erasable, and the advantage of ROM in which stored data can be preserved even when supplied power is interrupted. Such flash memory is widely used as the storage medium of portable electronic devices such as digital cameras, personal digital assistants (PDA), and MP3 players.

SUMMARY

A memory device in accordance with an embodiment of the present disclosure may include a memory block including a plurality of memory cells. The memory device may also include a peripheral circuit configured to perform an erase operation on the memory block by applying an erase voltage to a source line of the memory block, applying a word line voltage to word lines of the memory block, and applying a select line voltage to a select line of the memory block. The memory device may further include control logic configured to control the peripheral circuit to perform a suspend operation of suspending the erase operation in response to a suspend command and a resume operation of resuming the suspended erase operation. The control logic may be configured to adjust the level of the erase voltage, the word line voltage, or the select line voltage for an erase operation to be resumed during the resume operation based on the level of the erase voltage in the suspended erase operation.

A memory device in accordance with an embodiment of the present disclosure may include a memory block including a plurality of memory cells. The memory device may also include a source line driver configured to apply an erase voltage to a source line of the memory block during an erase operation and a voltage generating circuit configured to generate a word line voltage to be applied to word lines of the memory block and a select line voltage to be applied to select lines of the memory block during the erase operation. The memory device may further include control logic configured to control the source line driver and the voltage generating circuit to perform a suspend operation of suspending the erase operation in response to a suspend command and a resume operation of resuming the suspended erase operation. The control logic may be configured to detect a temperature during the suspend operation, and adjust the level of the erase voltage, the word line voltage, or the select line voltage for the erase operation to be resumed during the resume operation based on the detected temperate.

A method of operating a memory device in accordance with an embodiment of the present disclosure may include performing an erase operation on a memory block including a plurality of memory cells; performing a suspend operation of suspending the erase operation in response to a suspend command received during the erase operation; setting an erase voltage, a word line voltage, or a select line voltage to be used during a resume operation based on the level of the erase voltage used in the suspended erase operation; and performing the resume operation of resuming the suspended erase operation, wherein the erase operation is resumed using the set erase voltage, the set word line voltage, or the set select line voltage.

A method of operating a memory device in accordance with an embodiment of the present disclosure may include performing an erase operation on a memory block including a plurality of memory cells; performing a suspend operation of suspending the erase operation in response to a suspend command received during the erase operation; setting an erase voltage, a word line voltage, or a select line voltage to be used during a resume operation based on a time point at which the suspend operation is performed during the erase operation; and performing the resume operation of resuming the suspended erase operation, wherein the erase operation is resumed using the set erase voltage, the set word line voltage, or the set select line voltage.

A method of operating a memory device in accordance with an embodiment of the present disclosure may include performing an erase operation on a memory block including a plurality of memory cells; performing a suspend operation of suspending the erase operation in response to a suspend command received during the erase operation; detecting a temperature during the suspend operation, and setting an erase voltage, a word line voltage, or a select line voltage to be used during a resume operation based on the detected temperature; and performing the resume operation of resuming the suspended erase operation, wherein the erase operation is resumed using the set erase voltage, the set word line voltage, or the set select line voltage.

A method of operating a memory device in accordance with an embodiment of the present disclosure may include performing an erase operation on a memory block including a plurality of memory cells; performing a suspend operation of suspending the erase operation in response to a suspend command received during the erase operation; setting an erase voltage, a word line voltage, or a select line voltage to be used during a resume operation based on a number of times the suspend operation is performed during the erase operation; and performing the resume operation of resuming the suspended erase operation, wherein the erase operation is resumed using the set erase voltage, the set word line voltage, or the set select line voltage.

DETAILED DESCRIPTION

Specific structural or functional descriptions in embodiments of the present disclosure introduced in this specification or application are provided as examples to describe embodiments according to the concept of the present disclosure. Embodiments according to the concept of the present disclosure may be practiced in various forms and should not be construed as being limited to the embodiments described in the specification or application.

Hereinafter, the present disclosure will be described in detail by describing embodiments of the present disclosure with reference to the accompanying drawings. Embodiments of the present disclosure will be described in detail with reference to the attached drawings.

Some embodiments of the present disclosure are directed to a memory device and a method of operating the memory device, which are capable of improving the threshold voltage distributions of memory cells during an erase operation of the memory device.

Figure 1:
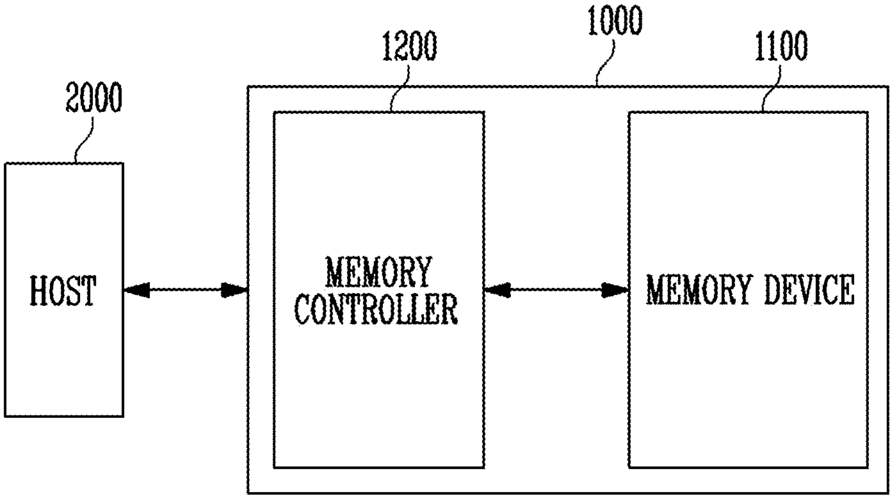
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a memory device 1100 which stores data, and a memory controller 1200 which controls the memory device 1100 under the control of a host 2000.

The host 2000 communicates with the memory system 1000 using an interface protocol, such as peripheral component interconnect-express (PCI-E), advanced technology attachment (ATA), serial ATA (SATA), parallel ATA (PATA) or serial attached SCSI (SAS). The interface protocol between the host 2000 and the memory system 1000 is not limited to the above-described examples, and may be one of various other interface protocols, such as universal serial bus (USB), multimedia card (MMC), enhanced small disk interface (ESDI), and integrated drive electronics (IDE).

The memory controller 1200 may control the overall operation of the memory system 1000 and may control data exchange between the host 2000 and the memory device 1100. For example, the memory controller 1200 may program, read, or erase data by controlling the memory device 1100 in response to a request received from the host 2000. In an embodiment, the memory device 1100 may include double data rate synchronous dynamic random-access memory (DDR SDRAM), low power double data rate fourth generation (LPDDR4) SDRAM, graphics double data rate (GDDR) SDRAM, low power DDR (LPDDR) SDRAM, Rambus DRAM (RDRAM), or flash memory.

The memory device 1100 may perform a program operation, a read operation, or an erase operation under the control of the memory controller 1200.

Figure 2:
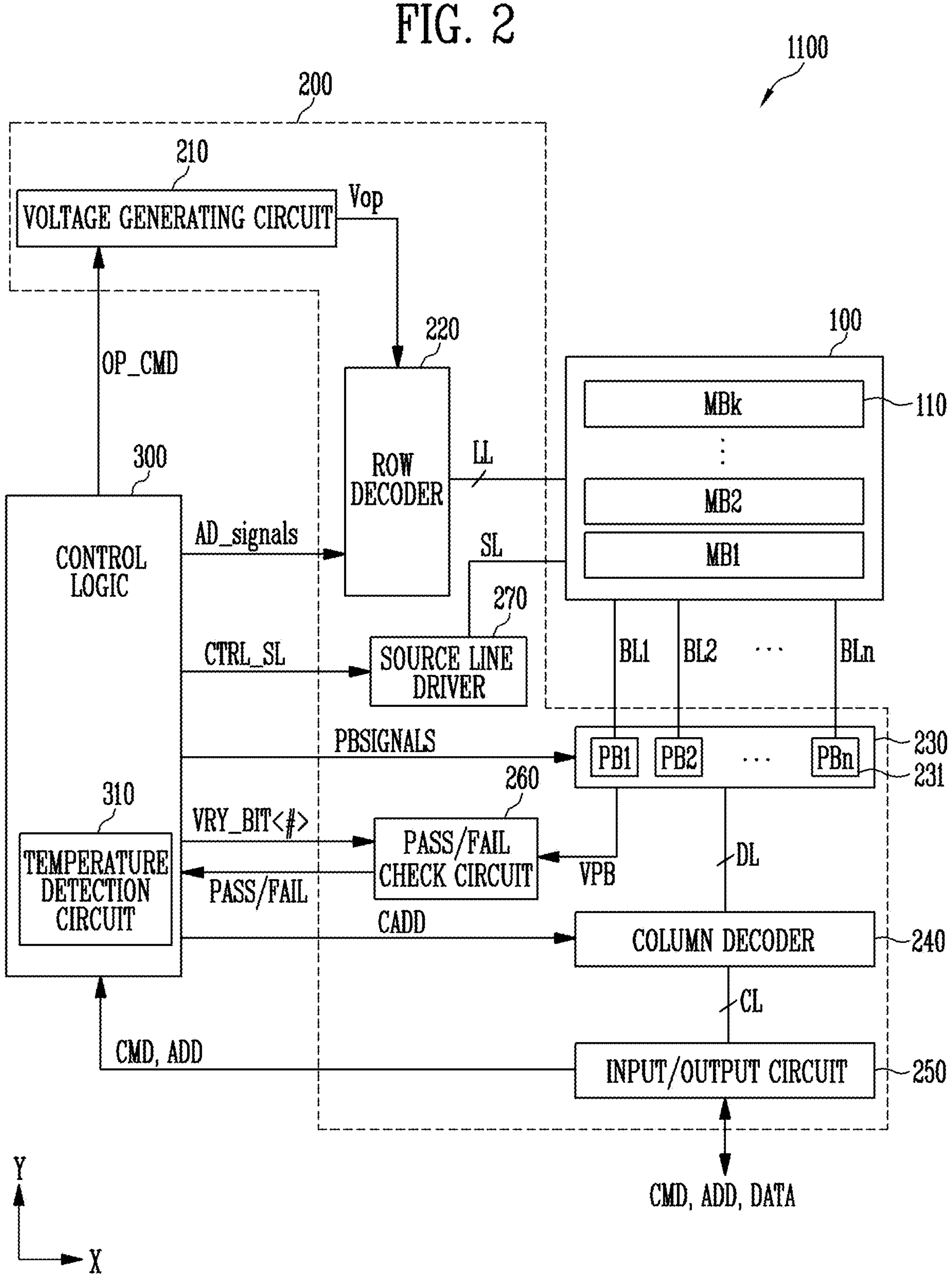
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may include a peripheral circuit 200 configured to perform a program operation for storing data in the memory cell array 100, a read operation for outputting the stored data, and an erase operation for erasing the stored data. The memory device 1100 may include control logic 300 which controls the peripheral circuit 200 under the control of a memory controller (e.g., 1200 of FIG. 1). The control logic 300 may be implemented as hardware, software, or a combination of hardware and software. For example, the control logic 300 may be a control logic circuit operating in accordance with an algorithm and/or a processor executing control logic code.

The memory cell array 100 may include a plurality of memory blocks MB1 to MBk 110 (where k is a positive integer). Local lines LL and bit lines BL1 to BLn (where n is a positive integer) may be coupled to each of the memory blocks MB1 to MBk 110. For example, the local lines LL may include a first select line, a second select line, and a plurality of word lines arranged between the first and second select lines. Also, the local lines LL may include dummy lines arranged between the first select line and the word lines and between the second select line and the word lines. Here, the first select line may be a source select line, and the second select line may be a drain select line. For example, the local lines LL may include the word lines, the drain and source select lines, and source lines. For example, the local lines LL may further include dummy lines. For example, the local lines LL may further include pipelines. The local lines LL may be coupled to each of the memory blocks MB1 to MBk 110, and the bit lines BL1 to BLn may be coupled in common to the memory blocks MB1 to MBk 110. The memory blocks MB1 to MBk 110 may each be implemented in a two-dimensional (2D) or three-dimensional (3D) structure. In one embodiment, memory cells in the memory blocks 110 having a 2D structure may be horizontally arranged on a substrate. In another embodiment, memory cells in the memory blocks 110 having a 3D structure may be vertically stacked on the substrate.

The peripheral circuit 200 may perform program, read, and erase operations on a selected memory block 110 under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop that are used for program, read, and erase operations in response to an operation signal OP_CMD. For example, the voltage generating circuit 210 may generate various voltages, such as a program voltage, verify voltages, pass voltages, a read voltage, a word line voltage, a select line voltage, etc. under the control of the control logic 300.

The row decoder 220 may transfer the operating voltages Vop to the local lines LL coupled to the selected memory block 110 in response to row decoder control signals AD_signals. The row decoder 220 may be included in the voltage generating circuit 210 in an embodiment.

The page buffer group 230 may include a plurality of page buffers PB1 to PBn 231 respectively coupled to the bit lines BL1 to BLn. The page buffers PB1 to PBn 231 may be operated in response to page buffer control signals PBSIGNALS. For example, the page buffers PB1 to PBn 231 may temporarily store data received through the bit lines BL1 to BLn or may sense voltages or currents of the bit lines BL1 to BLn during a read or verify operation. Further, the page buffer group 230 may apply an erase voltage to the bit lines BL1 to BLn during the erase operation.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transmit a command CMD and an address ADD, received from the memory controller (e.g., 1200 of FIG. 1), to the control logic 300, or may exchange data DATA with the column decoder 240.

During a read operation or a verify operation, the pass/fail check circuit 260 may generate a reference current in response to an enable bit VRY_BIT< #>, compare a sensing voltage VPB, received from the page buffer group 230, with a reference voltage, generated using the reference current, and then output a pass signal PASS or a fail signal FAIL.

The source line driver 270 may be coupled to memory cells included in the memory cell array 100 through the source line SL, and may control a voltage to be applied to the source line SL. In an example, the source line driver 270 may electrically connect the source line to a ground node during the program, read, or verify operation. Furthermore, the source line driver 270 may apply the erase voltage to the source line SL during the erase operation. The source line driver 270 may receive a source line control signal CTRL_SL from the control logic 300, and may connect the ground node to the source line or apply the erase voltage to the source line in response to the source line control signal CTRL_SL.

The control logic 300 may control the peripheral circuits 200 by outputting the operation signal OP_CMD, the row decoder control signals AD_signals, the page buffer control signals PBSIGNALS, and the enable bit VRY_BIT<#> in response to the command CMD and the address ADD. In addition, the control logic 300 may determine whether the verify operation has passed or failed in response to the pass or fail signal PASS or FAIL.

When a suspend command is received from the memory controller 1200 of FIG. 1 during the erase operation of the memory device 1100, the control logic 300 may perform a suspend operation of suspending the erase operation currently being performed, and may perform a resume operation of resuming the suspended erase operation by subsequently receiving a resume command from the memory controller 1200 of FIG. 1.

The control logic 300 may set the number of remaining erase pulse application loops of the suspended erase operation based on the level of the erase voltage, used in the suspended erase operation, during the suspend operation. For example, when the erase voltage of the suspended erase operation is equal to or higher than a first set level, the number of remaining erase pulse application loops may be decreased from a reference value, whereas, when the erase voltage of the suspended erase operation is lower than or equal to a second set level lower than the first set level, the number of remaining erase pulse application loops may be increased from a reference value. Also, the control logic 300 may limit the maximum allowable number of suspend operations or reset the erase voltage, the word line voltage, or the select line voltage by increasing or decreasing the erase voltage, the word line voltage, or the select line voltage from the reference voltage, based on the level of the erase voltage used in the suspended erase operation, during the suspend operation. When the maximum allowable number of suspend operations is limited, a suspend command exceeding the maximum allowable number is received, the erase operation currently being performed may be forcibly processed as erase completion.

The control logic 300 may control the peripheral circuit 200 to resume the suspended erase operation using the number of remaining erase pulse application loops set during the resume operation, the maximum allowable number of suspend operations, the reset erase voltage, the reset word line voltage, or the reset select line voltage.

The control logic 300 may include a temperature detection circuit 310. The temperature detection circuit 310 may measure the internal temperature of the memory device 1100 during the erase operation. The control logic 300 may set the number of remaining erase pulse application loops of the suspended erase operation during the suspend operation based on the internal temperature measured by the temperature detection circuit 310. Furthermore, the control logic 300 may limit the maximum allowable number of suspend operations by reducing the maximum allowable number, or may reset the erase voltage, the word line voltage, or the select line voltage by increasing or decreasing the erase voltage, the word line voltage, or the select line voltage from a reference value during the suspend operation, based on the internal temperature measured by the temperature detection circuit 310.

Figure 3:
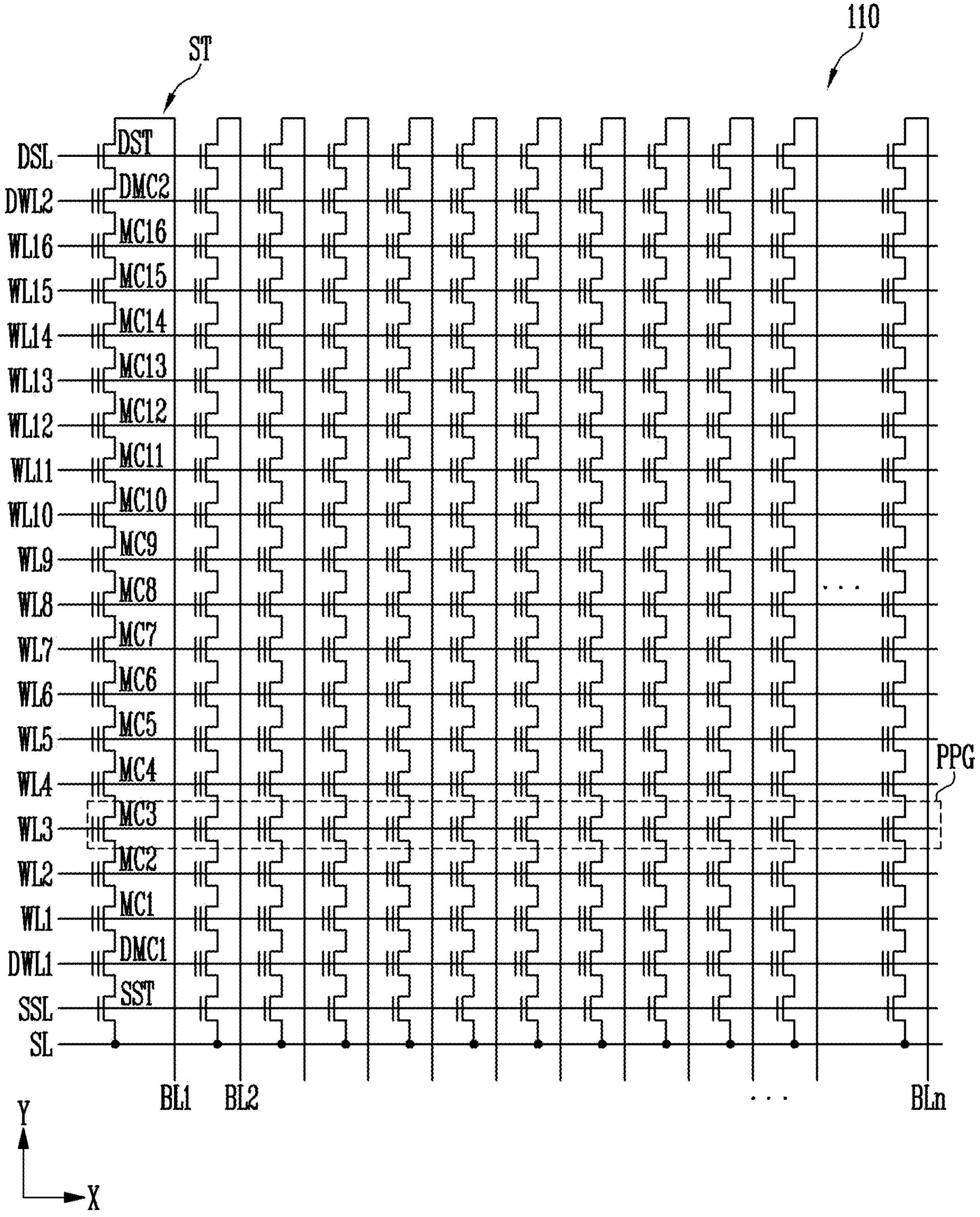
FIG. 3 is a diagram illustrating a memory block of FIG. 2.

FIG. 3 is a diagram illustrating the memory block of FIG. 2.

Referring to FIG. 3, a plurality of word lines arranged in parallel between a first select line and a second select line may be coupled to the memory block 110. Here, the first select line may be a source select line SSL, and the second select line may be a drain select line DSL. In detail, the memory block 110 may include a plurality of strings ST coupled between bit lines BL1 to BLn and a source line SL. The bit lines BL1 to BLn may be coupled to the strings ST, respectively, and the source line SL may be coupled in common to the strings ST. Because the strings ST may be equally configured, a string ST coupled to the first bit line BL1 will be described in detail by way of example.

The string ST may include a source select transistor SST, a plurality of memory cells MC1 to MC16, and a drain select transistor DST which are connected in series to each other between the source line SL and the first bit line BL1. A single string ST may include at least one source select transistor SST and at least one drain select transistor DST, and more memory cells than the memory cells MC1 to MC16 illustrated in the drawing may be included in the string ST.

A source of the source select transistor SST may be coupled to the source line SL, and a drain of the drain select transistor DST may be coupled to the first bit line BL1. The memory cells MC1 to MC16 may be connected in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells MC1 to MC16 may be coupled to a plurality of word lines WL1 to WL16, respectively. A group of memory cells coupled to the same word line, among the memory cells included in different strings ST, may be referred to as a "physical page: PPG". Therefore, the memory block 110 may include a number of physical pages (PPG) corresponding to the number of word lines WL1 to WL16.

At least one dummy memory cell DMC1 may be disposed between the source select transistor SST and the memory cell MC1, and at least one dummy memory cell DMC2 may be disposed between the drain select transistor DST and the memory cell MC16.

Further, dummy memory cells (not illustrated) may be disposed between memory cells (e.g., MC8 and MC9) disposed in a central region among the plurality of memory cells MC1 to MC16.

One memory cell may store one bit of data. This cell is typically designated as a "single-level cell (SLC)". Here, one physical page (PPG) may store data corresponding to one logical page (LPG). The data corresponding to one logical page (LPG) may include a number of data bits identical to the number of cells included in one physical page (PPG). Further, one memory cell may store two or more bits of data. This cell is typically designated as a "multi-level cell (MLC)". Here, one physical page (PPG) may store data corresponding to two or more logical pages (LPG).

Figure 4:
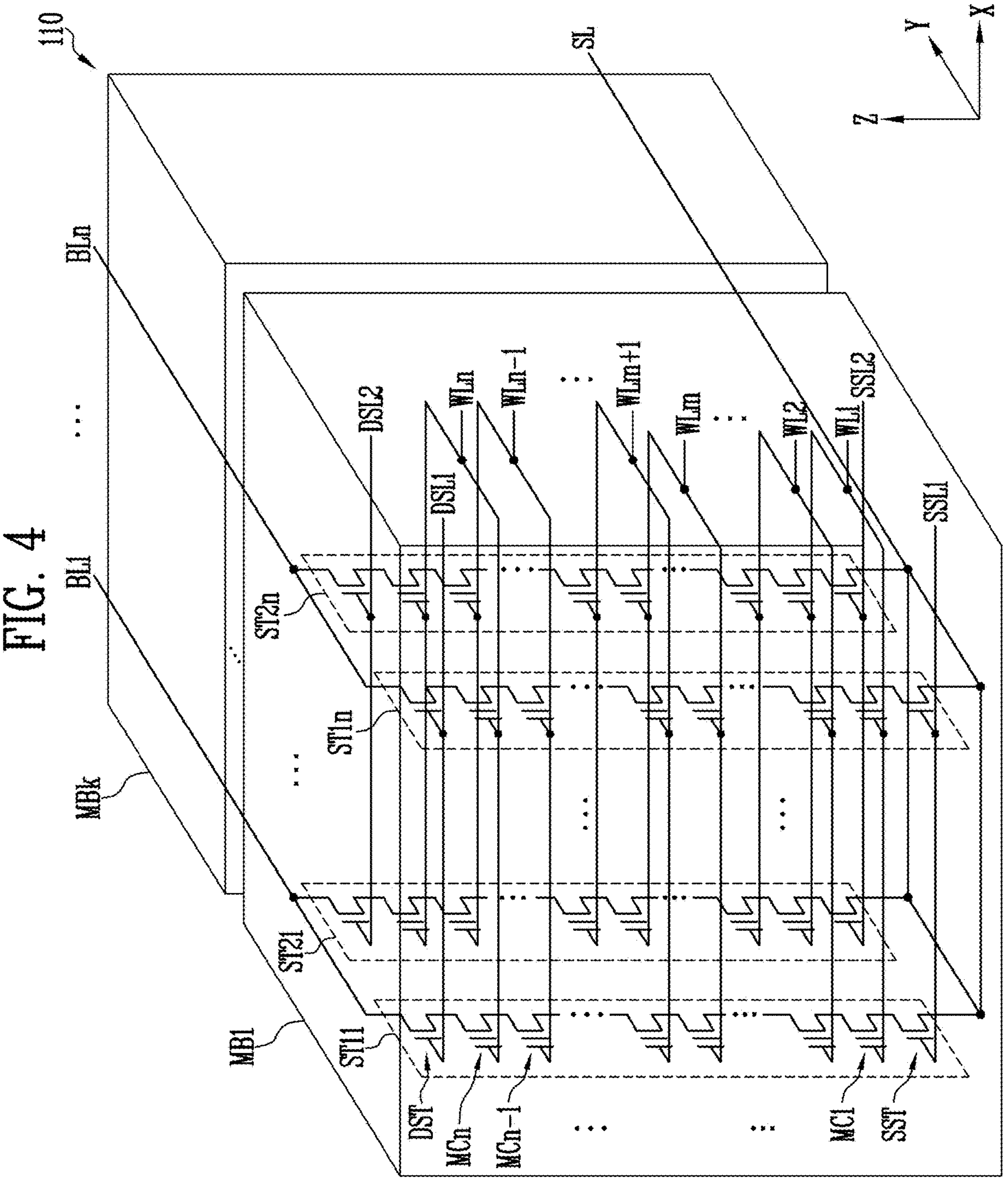
FIG. 4 is a diagram illustrating an embodiment of a memory block having a three-dimensional (3D) structure.

FIG. 4 is a diagram illustrating an embodiment of a memory block having a three-dimensional (3D) structure.

Referring to FIG. 4, the memory cell array 100 may include a plurality of memory blocks MB1 to MBk 110. A memory block 110 may include a plurality of strings ST11 to ST1n and ST21 to ST2n. Each of the plurality of strings ST11 to ST1n and ST21 to ST2n may extend along a vertical direction (e.g., Z direction). In the memory block 110, n strings may be arranged in a row direction (e.g., X direction). Although, in FIG. 4, two strings are illustrated as being arranged in a column direction (e.g., Y direction), this embodiment is given for convenience of description, and three or more strings may be arranged in the column direction (e.g., Y direction) in other embodiments.

Each of the strings ST11 to ST1n and ST21 to ST2n may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11 to ST1n arranged in a first row may be coupled to a first source select line SSL1. The source select transistors of the strings ST21 to ST2n arranged in a second row may be coupled to a second source select line SSL2. In other embodiments, the source select transistors of the strings ST11 to ST1n and ST21 to ST2n may be coupled in common to a single source select line.

The first to n-th memory cells MC1 to MCn in each string may be connected in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled.

The drain select transistor DST of each string may be coupled between the corresponding bit line and the memory cells MC1 to MCn. The drain select transistors DST of strings arranged in the row direction may be coupled to a drain select line extending in the row direction. The drain select transistors DST of the strings ST11 to ST1n in the first row may be coupled to a first drain select line DSL1. The drain select transistors DST of the strings ST21 to ST2n in the second row may be coupled to a second drain select line DSL2.

The plurality of memory blocks MB1 to MBk 110 described in FIG. 4 may share the source line SL.

Figure 5:
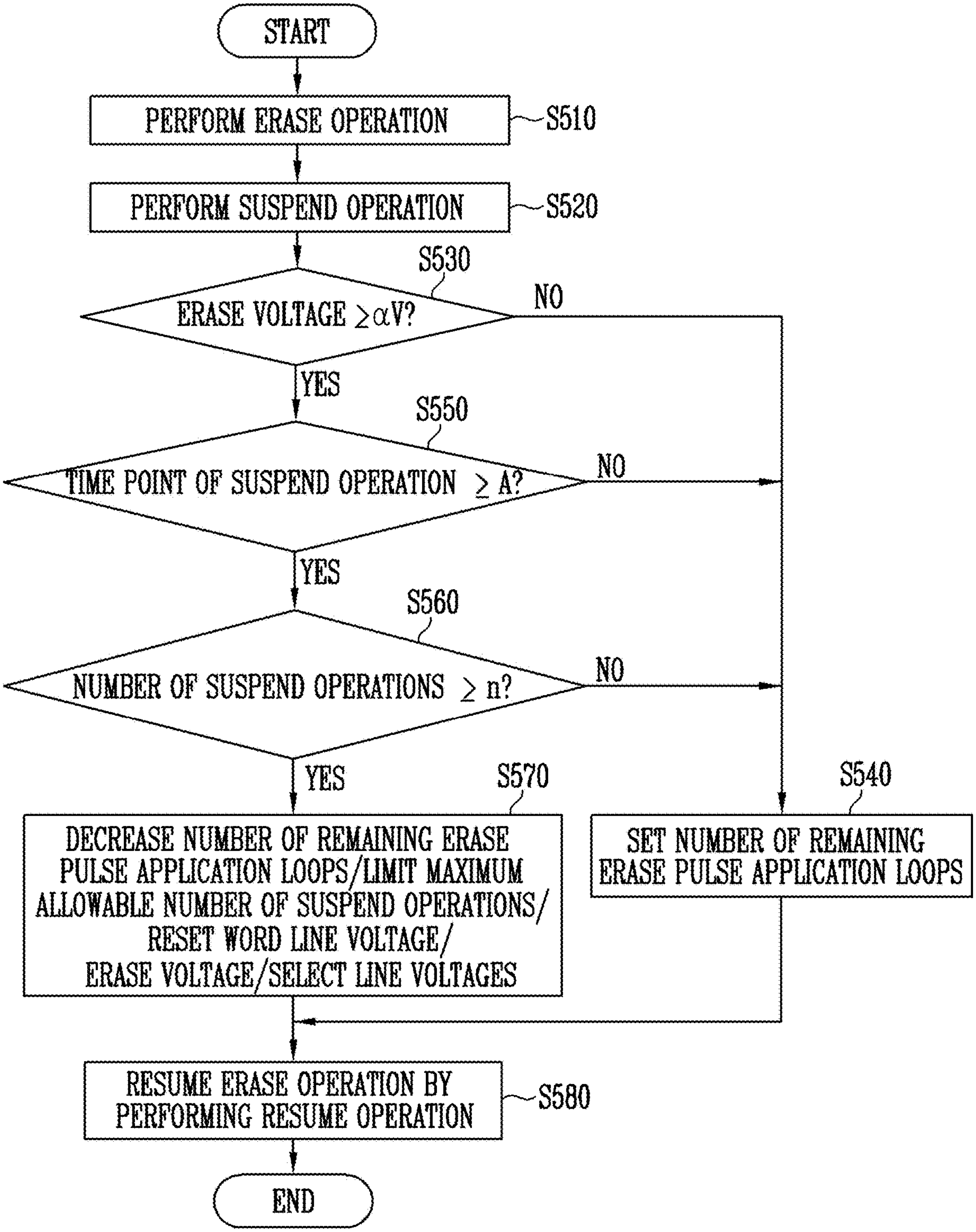
FIG. 5 is a flowchart illustrating a method of operating a memory device according to an embodiment of the present disclosure.

FIG. 5 is a flowchart illustrating a method of operating a memory device according to an embodiment of the present disclosure.

Figure 6:
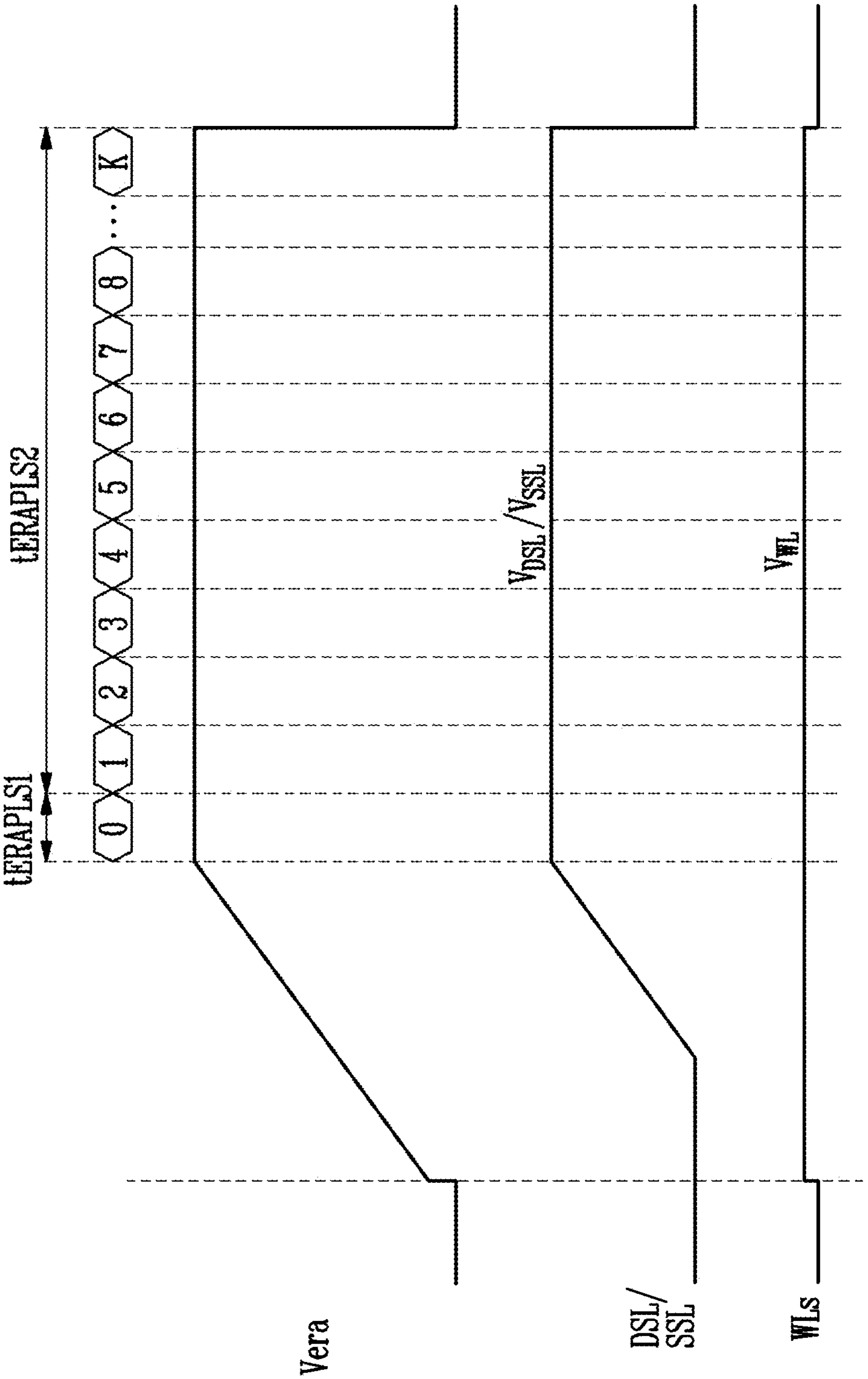
FIG. 6 is a waveform diagram of operating voltages for describing the operation of a memory device according to an embodiment of the present disclosure.

FIG. 6 is a waveform diagram of operating voltages for describing the operation of a memory device according to an embodiment of the present disclosure.

A method of operating the memory device according to an embodiment of the present disclosure is described with reference to FIGS. 2 to 6.

At S510, an erase operation may be performed. The memory device 1100 may receive a command CMD corresponding to the erase operation, and the control logic 300 may control the peripheral circuit 200 to perform the erase operation.

For example, during the erase operation, the source line driver 270 may apply an erase voltage Vera to the source line SL coupled to the selected memory block (e.g., MB1). The page buffers PB1 to PBn 231 may apply the erase voltage to bit lines BL1 to BLn.

The erase voltage Vera may gradually increase up to a target level during a rising period, and the erase voltage Vera at the target level may be applied to the source line SL during an erase pulse application operation period tERAPLS1 and tERAPLS2. The erase pulse application operation period tERAPLS1 and tERAPLS2 may include a first erase pulse application operation period tERAPLS1 including a first erase pulse application loop<0> and a second erase pulse application operation period tERAPLS2 including the remaining erase pulse application loops <1:K>. For example, the first erase pulse application loop<0> corresponding to the first erase pulse application operation period tERAPLS1 may be longer than the period of each of the plurality of erase pulse application loops <1:K> included in the second erase pulse application operation period tERAPLS2.

The voltage generating circuit 210 may generate a word line voltage VwL to be applied to the word lines WL1 to WLn of the selected memory block MB1 and select line voltages VDSL and Vssi to be applied to the drain select line DSL and the source select line SSL. The select line voltages VDSL and Vssi to be applied to the drain select line DSL and the source select line SSL may be generated to have a uniform level difference from the erase voltage Vera to generate a gate-induced drain leakage (GIDL) current in channel regions of the drain select transistor DST and the source select transistor SST to which the erase voltage Vera is applied.

The row decoder 220 may apply the word line voltage $V_{WL}$ and the select line voltages $V_{DSL}$ and $V_{SSL}$ generated by the voltage generating circuit 210 to the word lines WL1 to WLn, the drain select line DSL, and the source select line SSL of the selected memory block MB1.

At S520, during the erase operation, a suspend operation may be performed. The memory device 1100 may receive a command CMD corresponding to the suspend operation during the erase operation, and the control logic 300 may suspend the erase operation in response to the command CMD. Thereafter, the memory device 1100 may perform other general (normal) operations. When the command CMD corresponding to the suspend operation is received during the first erase pulse application operation period tERAPLS1, a weight may be assigned when the number of suspend operations (i.e., the number of times the suspend operation is performed) is counted. For example, when the command CMD corresponding to the suspend operation is received during an initial period of the first erase pulse application operation period tERAPLS1, the number of suspend operations might not be increased or may be increased by a value less than 1. Erase efficiency may be relatively reduced during the initial period of the first erase pulse application operation period tERAPLS1. Further, when the command CMD corresponding to the suspend operation is received during the initial period, memory cells may have shallow erase characteristics, whereby, to improve these characteristics, the number of suspend operations might not be increased or may be counted to be decreased from the actual number of suspend operations.

At S530, the control logic 300 may determine whether the level of the erase voltage Vera used in the suspended erase operation is equal to or higher than a first voltage $\alpha$V. For example, the first voltage V may be 17.5 V.

When it is determined at S530 that the level of the erase voltage Vera used in the suspended erase operation is lower than the first voltage $\alpha$V (in the case of No), the control logic 300 may set the number of remaining erase pulse application loops by calculating the number of erase pulse application loops that are suspended due to the suspend operation and are not yet performed at S540.

When it is determined at S530 that the level of the erase voltage Vera used in the suspended erase operation is equal to or higher than the first voltage $\alpha$V (in the case of Yes), the time point of the suspend operation is equal to a first set time point A or a time point after the first set time point A at S550. When the time point of the suspend operation is a time point before the first set time point A (in the case of No), a procedure starting from S540 may be performed. For example, the first set time point A may be a time point at which the threshold voltage distribution of the memory cells decreases when the suspend operation is performed.

For example, the first set time point A may be a time point at which the erase pulse application loop <10> starts. For example, the first set time point A may be a time point corresponding to 1000 μs.

When it is determined at S550 that the time point of the suspend operation is the first set time point A of the erase operation or the time point after the first set time point A (in the case of Yes), whether the number of suspend operations is equal to or greater than the first set number of times n may be determined at S560. When the number of suspend operations is less than the first set number of times n (in the case of No), a procedure starting from S540 may be performed. For example, the first set number of times n may be 50.

When the erase voltage Vera is equal to or higher than the first voltage $\alpha$V, when the time point of the suspend operation is the first set time point A of the erase operation or the time point after the first set time point A, and when the number of suspend operations is equal to or greater than the first set number of times n, the memory cells included in the selected memory block MB1 may have characteristics of being erased in the state in which the threshold voltage distribution thereof is lower than a threshold voltage distribution in a normal erase state due to the current erase operation.

When it is determined at S560 that the number of suspend operations is equal to or greater than the first set number of times n (in the case of Yes), the number of remaining erase pulse application loops of the erase operation to be resumed in the resume operation may be set to be decreased at S570. For example, the control logic 300 may calculate the number of erase pulse application loops that are suspended due to the suspend operation and are not yet performed, and may set the number of remaining erase pulse application loops by subtracting the set number of times from the calculated number of erase pulse application loops that are not yet performed.

Further, the control logic 300 may limit the maximum allowable number of suspend operations for the current erase operation. For example, when the maximum allowable number of suspend operations for the erase operation is 60, the maximum allowable number of suspend operations may be limited such that it is decreased by a set value. When a suspend command exceeding the maximum allowable number of suspend operations is received, the erase operation currently being performed may be forcibly processed as erase completion.

Furthermore, the control logic 300 may reset the word line voltage $V_{WL}$ to be used in the erase operation to be resumed during the resume operation by increasing the same, and may reset the select line voltages $V_{DSL}$ and $V_{SSL}$ or the erase voltage Vera by decreasing the same.

As described above, at S570, the control logic 300 may set the parameters of the erase operation to reduce a decrement by which the threshold voltages of the memory cells are decreased in the erase operation to be resumed during the resume operation.

After S540 or S570, the suspended erase operation may be resumed by performing a resume operation at S580.

In the above-described embodiment, although a description has been made such that the parameters of the erase operation are set to reduce a decrement by which the threshold voltages of the memory cells are decreased during the erase operation to be resumed, through S530, S550, S560, and S570 before the resume operation is performed at S580 after the suspend operation is performed at S520, the present disclosure is not limited thereto. That is, the parameters of the erase operation may be set to reduce the decrement by which the threshold voltages of the memory cells are decreased during the erase operation to be resumed by performing S530, S550, S560, and S570 after the starting of the resume operation at S580. For example, the erase operation may be resumed by performing the resume operation, and the above-described operations S530, S550, S560, and S570 may be performed before an erase status check operation of checking whether the resumed erase operation has been completed is performed.

In an embodiment of the above-described present disclosure, although a description has been made such that, when the result of determination is "yes" at each of S530, S550, and S560, S570 is performed, the present disclosure is not limited thereto. In an embodiment, when S530, S550, and S560 are separately performed, and the result of determination is "Yes" in at least one of those operations, operation S570 may be performed.

An embodiment of the present disclosure may determine whether the memory cells included in the selected memory block MB1 have deep erase characteristics, and may then improve the threshold voltage distribution of the memory cells in the erase operation by performing S570.

In an embodiment, whether the memory cells included in the selected memory block MB1 have shallow erase characteristics may be determined by determining whether the level of the erase voltage Vera is lower than or equal to a second voltage lower than the first voltage αV at S530, determining whether the time point of the suspend operation is a time point before a second set time point preceding the first set time point A at S550, and determining whether the number of suspend operations is less than or equal to the second set number of times less than the first set number of times n at S560. When it is determined that the memory cells have shallow erase characteristics, the word line voltage $V_{wL}$ may be reset to be decreased, and the select line voltages $V_{DSL}$ and $V_{SSL}$ or the erase voltage Vera may be reset to be increased at S570, and the erase operation may be resumed using the reset parameters of the erase operation.

Figure 7:
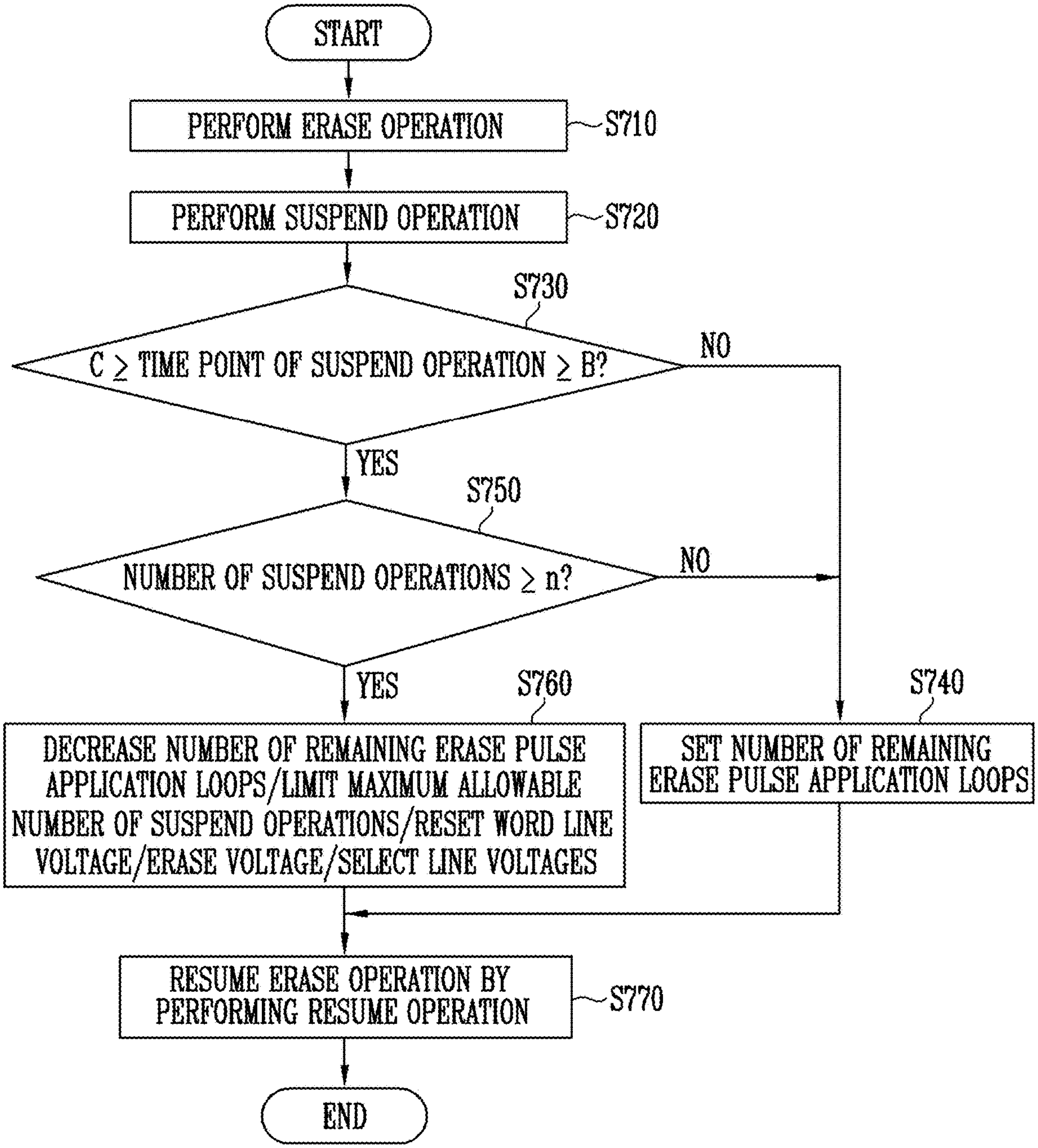
FIG. 7 is a flowchart illustrating a method of operating a memory device according to an embodiment of the present disclosure.

FIG. 7 is a flowchart illustrating a method of operating a memory device according to an embodiment of the present disclosure.

A method of operating the memory device according to an embodiment of the present disclosure is described with reference to FIGS. 2 to 4, 6, and 7.

At S710, an erase operation may be performed. The memory device 1100 may receive a command CMD corresponding to the erase operation, and the control logic 300 may control the peripheral circuit 200 to perform the erase operation.

For example, during the erase operation, the source line driver 270 may apply an erase voltage Vera to the source line SL coupled to the selected memory block (e.g., MB1). The page buffers PB1 to PBn 231 may apply the erase voltage to bit lines BL1 to BLn.

The erase voltage Vera may gradually increase up to a target level during a rising period, and the erase voltage Vera at the target level may be applied to the source line SL during an erase pulse application operation period tERAPLS1 and tERAPLS2. The erase pulse application operation period tERAPLS1 and tERAPLS2 may include a first erase pulse application operation period tERAPLS1 including a first erase pulse application loop<0> and a second erase pulse application operation period tERAPLS2 including the remaining erase pulse application loops <1:K>.

The voltage generating circuit 210 may generate a word line voltage $V_{WL}$ to be applied to the word lines WL1 to WLn of the selected memory block MB1 and select line voltages $V_{DSL}$ and $V_{SSL}$ to be applied to the drain select line DSL and the source select line SSL. The select line voltages $V_{DSL}$ and $V_{SSL}$ to be applied to the drain select line DSL and the source select line SSL may be generated to have a uniform level difference from the erase voltage Vera to generate a gate-induced drain leakage (GIDL) current in channel regions of the drain select transistor DST and the source select transistor SST to which the erase voltage Vera is applied.

The row decoder 220 may apply the word line voltage $V_{WL}$ and the select line voltages $V_{DSL}$ and $V_{SSL}$ generated by the voltage generating circuit 210 to the word lines WL1 to WLn, the drain select line DSL, and the source select line SSL of the selected memory block MB1.

At S720, during the erase operation, a suspend operation may be performed. The memory device 1100 may receive a command CMD corresponding to the suspend operation during the erase operation, and the control logic 300 may suspend the erase operation in response to the command CMD. Thereafter, the memory device 1100 may control other general operations.

When the command CMD corresponding to the suspend operation is received during the first erase pulse application operation period tERAPLS1, a weight may be assigned when the number of suspend operations is counted. For example, when the command CMD corresponding to the suspend operation is received during an initial period of the first erase pulse application operation period tERAPLS1, the number of suspend operations might not be increased or may be increased by a value less than 1. Erase efficiency may be relatively reduced during the initial period of the first erase pulse application operation period tERAPLS1. Further, when the command CMD corresponding to the suspend operation is received during the initial period, memory cells may have shallow erase characteristics, whereby, to improve these characteristics, the number of suspend operations might not be increased or may be counted to be decreased from the actual number of suspend operations.

At S730, the control logic 300 may determine whether the time point of the suspend operation is included in a set period from B to C of the erase operation. The set period from B to C may include an initial period of the erase operation, for example, a rising period in which the erase voltage Vera increases up to the target level, and an erase pulse application loop period <0:10>.

When it is determined at S730 that the time point of the suspend operation is not included in the set period from B to C of the erase operation (in the case of No), the control logic 300 may set the number of remaining erase pulse application loops by calculating the number of erase pulse application loops that are suspended due to the suspend operation and are not yet performed at S740.

When it is determined at S730 that the time point of the suspend operation is included in the set period from B to C of the erase operation (in the case of Yes), whether the number of suspend operations is equal to or greater than the first set number of times n may be determined at S750. When it is determined that the number of suspend operations is less than the first set number of times n (in the case of No), a procedure starting from S740 may be performed. For example, the first set number of times n may be 50.

When it is determined at S750 that the number of suspend operations is equal to or greater than the first set number of times n (in the case of Yes), the number of remaining erase pulse application loops of the erase operation to be resumed in the resume operation may be set to be decreased at S760. For example, the control logic 300 may calculate the number of erase pulse application loops that are suspended due to the suspend operation and are not yet performed, and may set the number of remaining erase pulse application loops by subtracting the set number of times from the calculated number of erase pulse application loops that are not yet performed.

Further, the control logic 300 may limit the maximum allowable number of suspend operations for the current erase operation so that a certain value is subtracted from the maximum allowable number. For example, when the maximum allowable number of suspend operations for the erase operation is 60, the maximum allowable number of suspend operations may be limited such that it is decreased by a set value.

Furthermore, the control logic 300 may reset the word line voltage $V_{WL}$ to be used in the erase operation to be resumed during the resume operation by increasing the same, and may reset the select line voltages $V_{DSL}$ and $V_{SSL}$ or the erase voltage Vera by decreasing the same.

As described above, at S760, the control logic 300 may set the parameters of the erase operation to reduce a decrement by which the threshold voltages of the memory cells are decreased in the erase operation to be resumed during the resume operation.

After S740 or S760, the suspended erase operation may be resumed by performing a resume operation at S770.

In an embodiment of the present disclosure, although a description has been made such that the parameters of the erase operation are set to reduce a decrement by which the threshold voltages of the memory cells are decreased during the erase operation to be resumed, through S730, S750, and S760 before the resume operation is performed at S770 after the suspend operation is performed at S720, the present disclosure is not limited thereto. That is, the parameters of the erase operation may be set to reduce the decrement by which the threshold voltages of the memory cells are decreased during the erase operation to be resumed by performing S730, S750, and S760 after the starting of the resume operation at S770. For example, the erase operation may be resumed by performing the resume operation, and the above-described operations S730, S750, and S760 may be performed before an erase status check operation of checking whether the resumed erase operation has been completed is performed.

An embodiment of the present disclosure may determine whether the memory cells included in the selected memory block MB1 have deep erase characteristics, and may then improve the threshold voltage distribution of the memory cells in the erase operation by performing S760.

In an embodiment, whether the memory cells have shallow erase characteristics may be determined based on the time point of the suspend operation at S730, and whether the memory cells have shallow erase characteristics may be determined based on the number of suspend operations at S750. When it is determined that the memory cells have shallow erase characteristics, the word line voltage $V_{WL}$ to be used in the erase operation to be resumed may be reset to be decreased, and the select line voltages $V_{DSL}$ and $V_{SSL}$ or the erase voltage Vera may be reset to be increased at S760. Thereafter, the erase operation may be resumed using the reset parameters of the erase operation.

Figure 8:
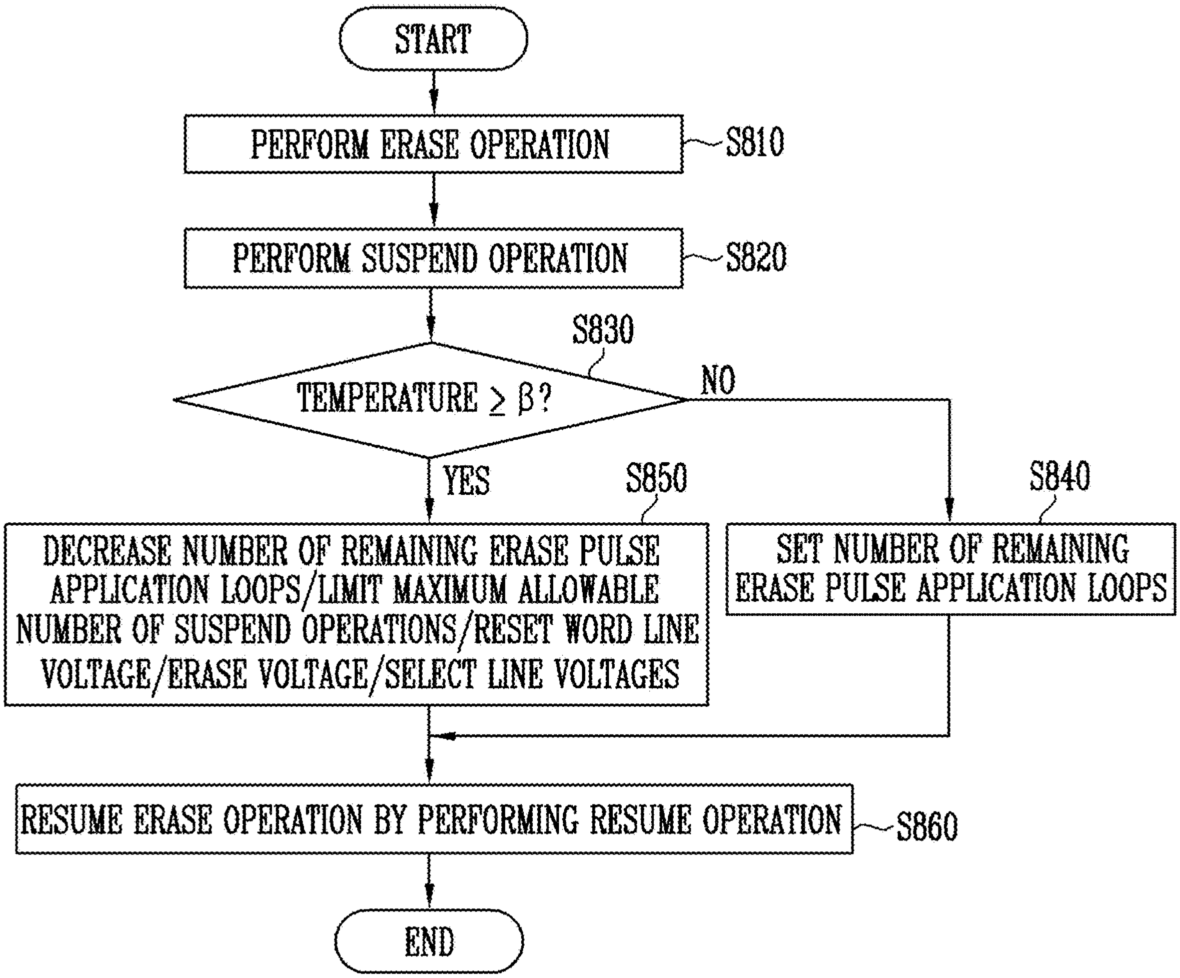
FIG. 8 is a flowchart illustrating a method of operating a memory device according to an embodiment of the present disclosure.

FIG. 8 is a flowchart illustrating a method of operating a memory device according to an embodiment of the present disclosure.

A method of operating the memory device according to an embodiment of the present disclosure is described with reference to FIGS. 2 to 4, 6, and 8.

At S810, an erase operation may be performed. The memory device 1100 may receive a command CMD corresponding to the erase operation, and the control logic 300 may control the peripheral circuit 200 to perform the erase operation.

For example, during the erase operation, the source line driver 270 may apply an erase voltage Vera to the source line SL coupled to the selected memory block (e.g., MB1). The page buffers PB1 to PBn 231 may apply the erase voltage to bit lines BL1 to BLn.

The erase voltage Vera may gradually increase up to a target level during a rising period, and the erase voltage Vera at the target level may be applied to the source line SL during an erase pulse application operation period tERAPLS1 and tERAPLS2. The erase pulse application operation period tERAPLS1 and tERAPLS2 may include a first erase pulse application operation period tERAPLS1 including a first erase pulse application loop<0> and a second erase pulse application operation period tERAPLS2 including the remaining erase pulse application loops <1:K>.

The voltage generating circuit 210 may generate a word line voltage $V_{WL}$ to be applied to the word lines WL1 to WLn of the selected memory block MB1 and select line voltages $V_{DSL}$ and $V_{ssL}$ to be applied to the drain select line DSL and the source select line SSL. The select line voltages $V_{DSL}$ and $V_{SSL}$ to be applied to the drain select line DSL and the source select line SSL may be generated to have a uniform level difference from the erase voltage Vera to generate a gate-induced drain leakage (GIDL) current in channel regions of the drain select transistor DST and the source select transistor SST to which the erase voltage Vera is applied.

The row decoder 220 may apply the word line voltage $V_{WL}$ and the select line voltages $V_{DSL}$ and $V_{SSL}$ generated by the voltage generating circuit 210 to the word lines WL1 to WLn, the drain select line DSL, and the source select line SSL of the selected memory block MB1.

At S820, during the erase operation, a suspend operation may be performed. The memory device 1100 may receive a command CMD corresponding to the suspend operation during the erase operation, and the control logic 300 may suspend the erase operation in response to the command CMD. Thereafter, the memory device 1100 may control other general operations.

When the command CMD corresponding to the suspend operation is received during the first erase pulse application operation period tERAPLS1, a weight may be assigned when the number of suspend operations is counted. For example, when the command CMD corresponding to the suspend operation is received during an initial period of the first erase pulse application operation period tERAPLS1, the number of suspend operations might not be increased, or may be increased by a value less than 1. Erase efficiency may be relatively reduced during the initial period of the first erase pulse application operation period tERAPLS1. Further, when the command CMD corresponding to the suspend operation is received during the initial period, memory cells may have shallow erase characteristics, whereby, to improve these characteristics, the number of suspend operations might not be increased, or may be counted to be decreased from the actual number of suspend operations.

At S830, the temperature detection circuit 310 of the control logic 300 may measure the internal temperature of the memory device 1100, and the control logic 300 may determine whether the internal temperature measured by the temperature detection circuit 310 is equal to or higher than a first temperature β. The memory cells included in the selected memory block MB1 may be erased in a threshold voltage distribution lower than a normal threshold voltage distribution when the internal temperature of the memory cells is equal to or higher than the first temperature β.

When it is determined at S830 that the internal temperature of the memory device 1100 is lower than the first temperature β (in the case of No), the control logic 300 may set the number of remaining erase pulse application loops by calculating the number of erase pulse application loops that are suspended due to the suspend operation and are not yet performed at S840.

When it is determined at S830 that the internal temperature of the memory device 1100 is equal to or higher than the first temperature β (in the case of Yes), the number of remaining erase pulse application loops of the erase operation to be resumed during the resume operation may be reduced and set at S850. For example, the control logic 300 may calculate the number of erase pulse application loops that are suspended due to the suspend operation and are not yet performed, and may set the number of remaining erase pulse application loops by subtracting the set number of times from the calculated number of erase pulse application loops that are not yet performed.

Further, the control logic 300 may limit the maximum allowable number of suspend operations for the current erase operation so that a certain value is subtracted from the maximum allowable number. For example, when the maximum allowable number of suspend operations for the erase operation is 60, the maximum allowable number of suspend operations may be limited such that it is decreased by a set value.

Furthermore, the control logic 300 may reset the word line voltage $V_{WL}$ to be used in the erase operation to be resumed during the resume operation by increasing the same, and may reset the select line voltages $V_{DSL}$ and $V_{SSL}$ or the erase voltage Vera by decreasing the same.

As described above, at S850, the control logic 300 may set the parameters of the erase operation to reduce a decrement by which the threshold voltages of the memory cells are decreased in the erase operation to be resumed during the resume operation.

After S840 or S850, the suspended erase operation may be resumed by performing a resume operation at S860.

In an embodiment of the present disclosure, although a description has been made such that the parameters of the erase operation are set to reduce a decrement by which the threshold voltages of the memory cells are decreased during the erase operation to be resumed, through S830 and S850 before the resume operation is performed at S860 after the suspend operation is performed at S820, the present disclosure is not limited thereto. That is, the parameters of the erase operation may be set to reduce the decrement by which the threshold voltages of the memory cells are decreased during the erase operation to be resumed by performing S830 and S850 after the starting of the resume operation at S860. For example, the erase operation may be resumed by performing the resume operation, and the above-described operations S830 and S850 may be performed before an erase status check operation of checking whether the resumed erase operation has been completed is performed.

In the above-described embodiment, when the temperature of the memory device 1100 is equal to or higher than the first temperature β, whether the memory cells included in the selected memory block MB1 have deep erase characteristics may be determined, and the threshold voltage distribution of the memory cells in the erase operation may be improved at S850.

In an embodiment, when it is determined at S830 that the temperature of the memory device 1100 is lower than or equal to a second temperature lower than the first temperature, whether the memory cells included in the selected memory block MB1 have shallow erase characteristics may be determined. At S850, the word line voltage $V_{WL}$ to be used in the erase operation to be resumed may be reset to be decreased, and the select line voltages $V_{DSL}$ and $V_{SSL}$ or the erase voltage Vera may be reset to be increased. Thereafter, the erase operation may be resumed using the reset parameters of the erase operation.

An embodiment of the present disclosure may be performed together with the embodiment illustrated in FIG. 5 or the embodiment illustrated in FIG. 7.

Figure 9:
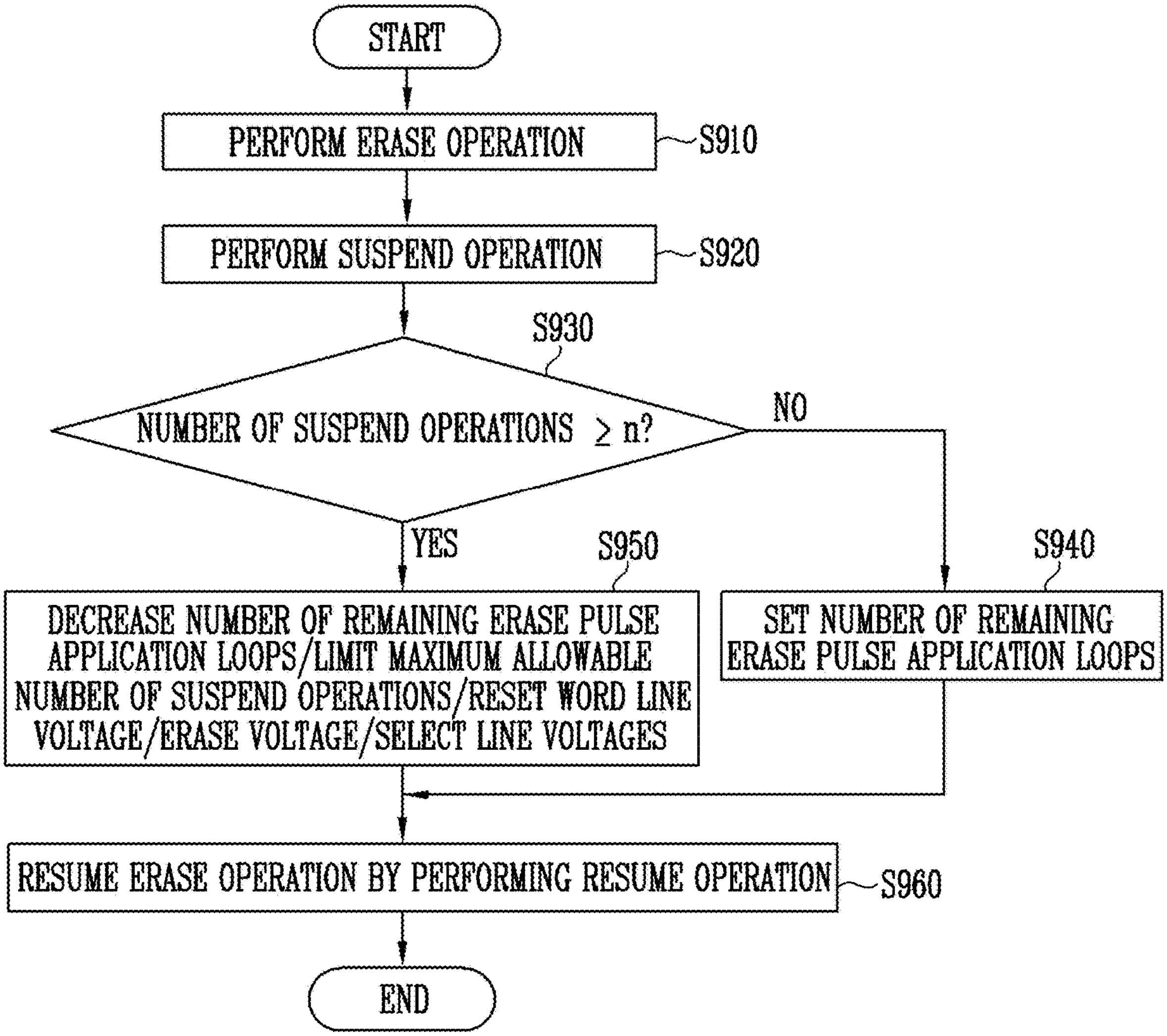
FIG. 9 is a flowchart illustrating a method of operating a memory device according to an embodiment of the present disclosure.

FIG. 9 is a flowchart illustrating a method of operating a memory device according to an embodiment of the present disclosure.

A method of operating the memory device according to an embodiment of the present disclosure is described with reference to FIGS. 2 to 4, 6, and 9.

At S910, an erase operation may be performed. The memory device 1100 may receive a command CMD corresponding to the erase operation, and the control logic 300 may control the peripheral circuit 200 to perform the erase operation.

For example, during the erase operation, the source line driver 270 may apply an erase voltage Vera to the source line SL coupled to the selected memory block (e.g., MB1). The page buffers PB1 to PBn 231 may apply the erase voltage to bit lines BL1 to BLn.

The erase voltage Vera may gradually increase up to a target level during a rising period, and the erase voltage Vera at the target level may be applied to the source line SL during an erase pulse application operation period tERAPLS1 and tERAPLS2. The erase pulse application operation period tERAPLS1 and tERAPLS2 may include a first erase pulse application operation period tERAPLS1 including a first erase pulse application loop<0> and a second erase pulse application operation period tERAPLS2 including the remaining erase pulse application loops <1:K>.

The voltage generating circuit 210 may generate a word line voltage $V_{WL}$ to be applied to the word lines WL1 to WLn of the selected memory block MB1 and select line voltages $V_{DSL}$ and $V_{SSL}$ to be applied to the drain select line DSL and the source select line SSL. The select line voltages $V_{DSL}$ and $V_{SSL}$ to be applied to the drain select line DSL and the source select line SSL may be generated to have a uniform level difference from the erase voltage Vera to generate a gate-induced drain leakage (GIDL) current in channel regions of the drain select transistor DST and the source select transistor SST to which the erase voltage Vera is applied.

The row decoder 220 may apply the word line voltage $V_{WL}$ and the select line voltages $V_{DSL}$ and $V_{SSL}$ generated by the voltage generating circuit 210 to the word lines WL1 to WLn, the drain select line DSL, and the source select line SSL of the selected memory block MB1.

At S920, during the erase operation, a suspend operation may be performed. The memory device 1100 may receive a command CMD corresponding to the suspend operation during the erase operation, and the control logic 300 may suspend the erase operation in response to the command CMD. Thereafter, the memory device 1100 may control other general operations.

When the command CMD corresponding to the suspend operation is received during the first erase pulse application operation period tERAPLS1, a weight may be assigned when the number of suspend operations is counted. For example, when the command CMD corresponding to the suspend operation is received during an initial period of the first erase pulse application operation period tERAPLS1, the number of suspend operations might not be increased, or may be increased by a value less than 1. Erase efficiency may be relatively reduced during the initial period of the first erase pulse application operation period tERAPLS1. Further, when the command CMD corresponding to the suspend operation is received during the initial period, memory cells may have shallow erase characteristics, whereby, to improve these characteristics, the number of suspend operations might not be increased, or may be counted to be decreased from the actual number of suspend operations.

At S930, the control logic 300 may determine whether the number of suspend operations is equal to or greater than the first set number of times n. For example, the first set number of times n may be 50.

As the number of suspend operations increases, a rising period during which the erase voltage Vera increases up to the target level may be repeated, and thus the memory cells may be erased such that threshold voltages thereof are lower than those in a normal range.

When it is determined at S930 that the number of suspend operations is less than the first set number of times n (in the case of No), the control logic 300 may set the number of remaining erase pulse application loops by calculating the number of erase pulse application loops that are suspended due to the suspend operation and are not yet performed at S940.

When it is determined at S930 that the number of suspend operations is equal to or greater than the set number of times n (in the case of Yes), the number of remaining erase pulse application loops of the erase operation to be resumed during the resume operation may be reduced and set at S950. For example, the control logic 300 may calculate the number of erase pulse application loops that are suspended due to the suspend operation and are not yet performed, and may set the number of remaining erase pulse application loops by subtracting the set number of times from the calculated number of erase pulse application loops that are not yet performed.

Further, the control logic 300 may limit the maximum allowable number of suspend operations for the current erase operation so that a certain value is subtracted from the maximum allowable number. For example, when the maximum allowable number of suspend operations for the erase operation is 60, the maximum allowable number of suspend operations may be limited such that it is decreased by a set value.

Furthermore, the control logic 300 may reset the word line voltage $V_{WL}$ to be used in the erase operation to be resumed during the resume operation by increasing the same, and may reset the select line voltages $V_{DSL}$ and $V_{SSL}$ or the erase voltage Vera by decreasing the same.

As described above, at S950, the control logic 300 may set the parameters of the erase operation to reduce a decrement by which the threshold voltages of the memory cells are decreased in the erase operation to be resumed during the resume operation.

After S940 or S950, the suspended erase operation may be resumed by performing a resume operation at S960.

In an embodiment of the present disclosure, although a description has been made such that the parameters of the erase operation are set to reduce a decrement by which the threshold voltages of the memory cells are decreased during the erase operation to be resumed, through S930 and S950 before the resume operation is performed at S960 after the suspend operation is performed at S920, the present disclosure is not limited thereto. That is, the parameters of the erase operation may be set to reduce the decrement by which the threshold voltages of the memory cells are decreased during the erase operation to be resumed by performing S930 and S950 after the starting of the resume operation at S960. For example, the erase operation may be resumed by performing the resume operation, and the above-described operations S930 and S950 may be performed before an erase status check operation of checking whether the resumed erase operation has been completed is performed.

Figure 10:
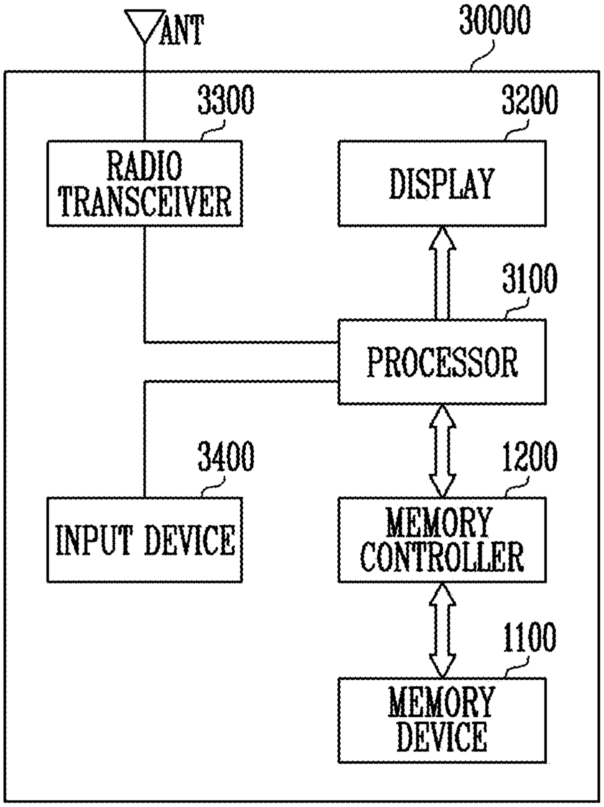
FIG. 10 is a diagram illustrating an embodiment of a memory system including the memory device of FIG. 2.

FIG. 10 is a diagram illustrating an embodiment of a memory system including the memory device of FIG. 2.

Referring to FIG. 10, a memory system 30000 may be implemented as a cellular phone, a smartphone, a tablet PC, a personal digital assistant (PDA), or a wireless communication device. The memory system 30000 may include a memory device 1100 and a memory controller 1200 that is capable of controlling the operation of the memory device 1100. The memory controller 1200 may control a data access operation of the memory device 1100, for example, a program operation, an erase operation, or a read operation, under the control of a processor 3100.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that can be processed by the processor 3100. Therefore, the processor 3100 may process the signals output from the radio transceiver 3300, and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals, and output the converted radio signals to an external device through the antenna ANT. An input device 3400 may be a device capable of inputting a control signal for controlling the operation of the processor 3100 or data to be processed by the processor 3100, and may be implemented as a pointing device such as a touch pad, a computer mouse, a keypad, or a keyboard. The processor 3100 may control the operation of the display 3200 such that data output from the memory controller 1200, data output from the radio transceiver 3300, or data output from the input device 3400 can be output via the display 3200.

In accordance with an embodiment, the memory controller 1200, which is capable of controlling the operation of the memory device 1100, may be implemented as part of the processor 3100 or as a chip separate from the processor 3100.

Figure 11:
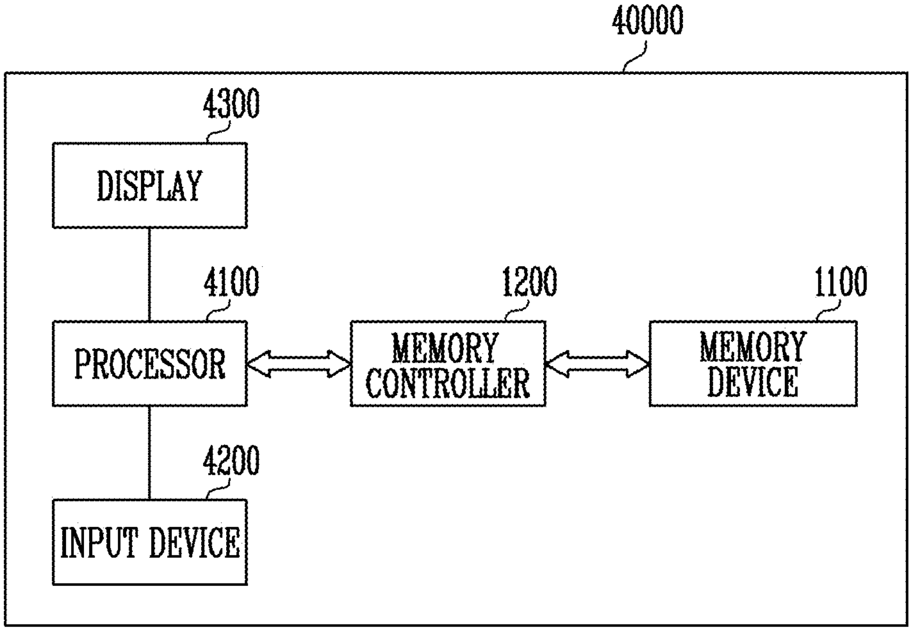
FIG. 11 is a diagram illustrating an embodiment of a memory system including the memory device of FIG. 2.

FIG. 11 is a diagram illustrating an embodiment of a memory system including the memory device of FIG. 2.

Referring to FIG. 11, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling the data processing operation of the memory device 1100.

A processor 4100 may output data stored in the memory device 1100 via a display 4300 according to data input from an input device 4200. For example, the input device 4200 may be implemented as a point device such as a touch pad, a computer mouse, a keypad, or a keyboard.

The processor 4100 may control the overall operation of the memory system 40000 and control the operation of the memory controller 1200. In an embodiment, the memory controller 1200, which is capable of controlling the operation of the memory device 1100, may be implemented as a part of the processor 4100 or as a chip separate from the processor 4100.

Figure 12:
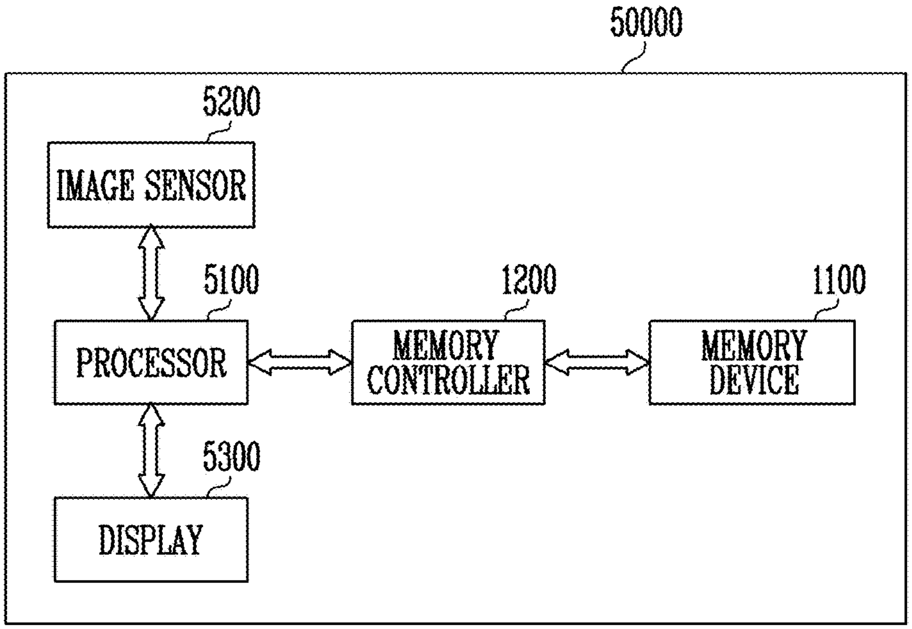
FIG. 12 is a diagram illustrating an embodiment of a memory system including the memory device of FIG. 2.

FIG. 12 is a diagram illustrating an embodiment of a memory system including the memory device of FIG. 2.

Referring to FIG. 12, a memory system 50000 may be implemented as an image processing device, for example, a digital camera, a cellular phone provided with a digital camera, a smartphone provided with a digital camera, or a tablet PC provided with a digital camera.

The memory system 50000 may include a memory device 1100 and a memory controller 1200 which may control a data processing operation of the memory device 1100, that is, a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output via a display 5300 or stored in the memory device 1100 through the memory controller 1200. Further, the data stored in the memory device 1100 may be output via the display 5300 under the control of the processor 5100 or the memory controller 1200.

In accordance with an embodiment, the memory controller 1200, which is capable of controlling the operation of the memory device 1100, may be implemented as a part of the processor 5100 or as a chip separate from the processor 5100.

Figure 13:
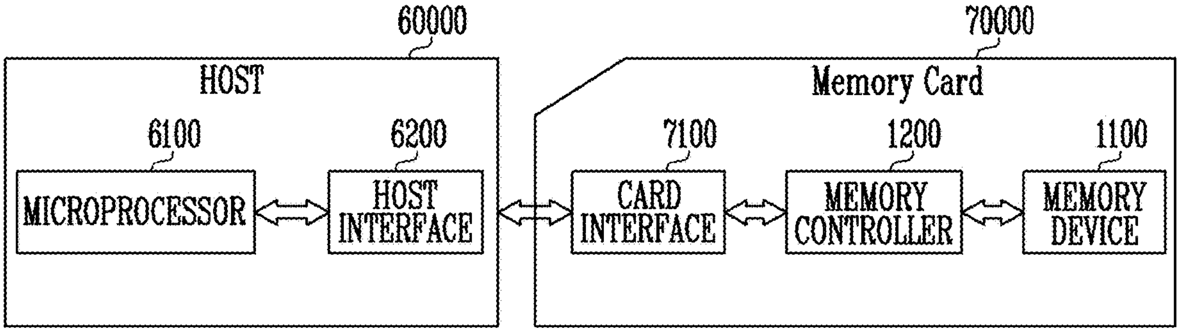
FIG. 13 is a diagram illustrating an embodiment of a memory system including the memory device of FIG. 2.

FIG. 13 is a diagram illustrating an embodiment of a memory system including the memory device of FIG. 2.

Referring to FIG. 13, a memory system 70000 may be implemented as a memory card or a smart card. The memory system 70000 may include a memory device 1100, a memory controller 1200, and a card interface 7100.

The memory controller 1200 may control the data exchange between the memory device 1100 and the card interface 7100. In an embodiment, the card interface 7100 may be, but is not limited to, a secure digital (SD) card interface or a multimedia card (MMC) interface.

The card interface 7100 may interface data exchanged between a host 60000 and the memory controller 1200 according to a protocol of the host 60000. In accordance with an embodiment, the card interface 7100 may support a universal serial bus (USB) protocol and an interchip (IC)-USB protocol. Here, the card interface may refer to hardware capable of supporting a protocol which is used by the host 60000, software installed in the hardware, or a signal transmission method.

When the memory system 70000 is coupled to a host interface 6200 of the host 60000, such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

According to the present disclosure, the threshold voltage distributions of memory cells during an erase operation of a memory device may be improved.

What is claimed is:

1. A memory device comprising:

a memory block including a plurality of memory cells;

a peripheral circuit configured to perform an erase operation on the memory block by applying an erase voltage to a source line of the memory block, applying a word line voltage to word lines of the memory block, and applying a select line voltage to a select line of the memory block; and control logic configured to control the peripheral circuit to perform a suspend operation of suspending the erase operation in response to a suspend command and a resume operation of resuming the suspended erase operation, wherein the control logic is configured to adjust at least one of a level of the erase voltage, a level of the word line voltage, or a level of the select line voltage for an erase operation to be resumed during the resume operation based on the level of the erase voltage in the suspended erase operation:

wherein the erase operation comprises a plurality of erase pulse application loops;

wherein the control logic is configured to:

perform a first set operation setting a number of remaining erase pulse application loops by calculating a number of erase pulse application loops that are suspended due to the suspend operation and are not yet performed; and when the level of the erase voltage in the suspended erase operation is lower than or equal to a level of a reference voltage, perform a second set operation setting the number of remaining erase pulse application loops by increasing the number of remaining erase pulse application loops.

2. The memory device according to claim 1, wherein the control logic is configured to, when the level of the erase voltage in the suspended erase operation is equal to or higher than a first voltage, set the erase voltage for the erase operation to be resumed by decreasing the level of the erase voltage from a first reference value, set the word line voltage by increasing the level of the word line voltage from a second reference value, and set the select line voltage by decreasing the level of the select line voltage from a third reference value.

3. The memory device according to claim 2, wherein the control logic is configured to, when the level of the erase voltage in the suspended erase operation is lower than or equal to a second voltage lower than the first voltage, set the erase voltage for the erase operation to be resumed by increasing the level of the erase voltage from the first reference value, set the word line voltage by decreasing the level of the word line voltage from the second reference value, and set the select line voltage by increasing the level of the select line voltage from the third reference value.

4. The memory device according to claim 1, wherein the control logic is configured to adjust a maximum allowable number of suspend operations that are capable of being performed during the erase operation based on the level of the erase voltage in the suspended erase operation.

5. The memory device according to claim 1, wherein the control logic is configured to adjust at least one of the level of the erase voltage, the level of the word line voltage, or the level of the select line voltage for the erase operation to be resumed during the resume operation based on a time point at which the suspend operation is performed during the erase operation.

6. The memory device according to claim 1, wherein the control logic is configured to adjust at least one of the level of the erase voltage, the level of the word line voltage, or the level of the select line voltage for the erase operation to be resumed during the resume operation based on a number of times the suspend operation is performed during the erase operation.

7. A memory device comprising:

a memory block including a plurality of memory cells;

a source line driver configured to apply an erase voltage to a source line of the memory block during an erase operation;

a voltage generating circuit configured to generate a word line voltage to be applied to word lines of the memory block and a select line voltage to be applied to select lines of the memory block during the erase operation; and control logic configured to control the source line driver and the voltage generating circuit to perform a suspend operation of suspending the erase operation in response to a suspend command and a resume operation of resuming the suspended erase operation;

wherein the control logic is configured to detect a temperature during the suspend operation, and adjust at least one of a level of the erase voltage, a level of the word line voltage, or a level of the select line voltage for the erase operation to be resumed during the resume operation based on the detected temperate;

wherein the control logic is configured to, when the detected temperature is equal to or higher than a first temperature, set the erase voltage for the erase operation to be resumed by decreasing the level of the erase voltage from a first reference value, set the word line voltage by increasing the level of the word line voltage from a second reference value, and set the select line voltage by decreasing the level of the select line voltage from a third reference value.

8. The memory device according to claim 7, further comprising a page buffer group coupled to bit lines of the memory block and configured to apply the erase voltage to the bit lines during the erase operation.

9. The memory device according to claim 7, wherein the control logic is configured to, when the detected temperature is lower than or equal to a second temperature lower than the first temperature, set the erase voltage for the erase operation to be resumed by increasing the level of the erase voltage from the first reference value, set the word line voltage by decreasing the level of the word line voltage from the second reference value, and set the select line voltage by increasing the level of the select line voltage from the third reference value.

10. The memory device according to claim 7, wherein the control logic is configured to adjust at least one of the level of the erase voltage, the word line voltage, or the select line voltage for the erase operation to be resumed during the resume operation based on the level of the erase voltage in the suspended erase operation.

11. The memory device according to claim 7, wherein the control logic is configured to adjust at least one of the level of the erase voltage, the word line voltage, or the select line voltage for the erase operation to be resumed during the resume operation based on a time point at which the suspend operation is performed during the erase operation.

12. The memory device according to claim 7, wherein the control logic is configured to adjust at least one of the level of the erase voltage, the word line voltage, or the select line voltage for the erase operation to be resumed during the resume operation based on a number of times the suspend operation is performed during the erase operation.

13. A method of operating a memory device, the method comprising:

performing an erase operation on a memory block including a plurality of memory cells;

performing a suspend operation of suspending the erase operation in response to a suspend command received during the erase operation;

setting at least one of an erase voltage, a word line voltage, or a select line voltage to be used during a resume operation based on a level of the erase voltage used in the suspended erase operation; and performing the resume operation of resuming the suspended erase operation, wherein the erase operation is resumed using at least one of the set erase voltage, the set word line voltage, or the set select line voltage;

wherein setting the erase voltage, the word line voltage, or the select line voltage comprises, when the level of the erase voltage in the suspended erase operation is equal to or higher than a first voltage, setting the erase voltage for the erase operation to be resumed by decreasing the level of the erase voltage from a first reference value, setting the word line voltage by increasing the level of the word line voltage from a second reference value, and setting the select line voltage by decreasing a level of the select line voltage from a third reference value.

14. The method according to claim 13, wherein setting at least one of the erase voltage, the word line voltage, or the select line voltage further comprises when the level of the erase voltage in the suspended erase operation is lower than or equal to a second voltage lower than the first voltage, setting the erase voltage for the erase operation to be resumed by increasing the level of the erase voltage from the first reference value, setting the word line voltage by decreasing the level of the word line voltage from the second reference value, and setting the select line voltage by increasing the level of the select line voltage from the third reference value.

15. The method according to claim 13, further comprising setting at least one of the erase voltage, the word line voltage, or the select line voltage to be used during the resume operation based on a time point at which the suspend operation is performed during the erase operation.

16. The method according to claim 13, further comprising setting at least one of the erase voltage, the word line voltage, or the select line voltage to be used during the resume operation based on a number of times the suspend operation is performed during the erase operation.

17. The method according to claim 13, further comprising setting a number of remaining erase pulse application loops by calculating a number of erase pulse application loops that are suspended due to the suspend operation and are not yet performed before the resume operation is performed.

18. The method according to claim 17, further comprising setting the number of remaining erase pulse application loops by decreasing or increasing the number of remaining erase pulse application loops based on the level of the erase voltage used in the suspended erase operation.

19. A method of operating a memory device, the method comprising:

performing an erase operation on a memory block including a plurality of memory cells;

performing a suspend operation of suspending the erase operation in response to a suspend command received during the erase operation;

setting at least one of an erase voltage, a word line voltage, or a select line voltage to be used during a resume operation based on a time point at which the suspend operation is performed during the erase operation; and performing the resume operation of resuming the suspended erase operation, wherein the erase operation is resumed using at least one of the set erase voltage, the set word line voltage, or the set select line voltage; and performing a first set operation and a second set operation;

wherein the erase operation comprises a plurality of erase pulse application loops;

wherein the first set operation comprises setting a number of remaining erase pulse application loops by calculating a number of erase pulse application loops that are suspended due to the suspend operation and are not yet performed; and wherein the second set operation comprises, when the level of the erase voltage in the suspended erase operation is lower than or equal to a level of a reference voltage, setting the number of remaining erase pulse application loops by increasing the number of remaining erase pulse application loops.

20. The method according to claim 19, further comprising adjusting at least one of a level of the erase voltage, a level of the word line voltage, or a level of the select line voltage for the erase operation to be resumed during the resume operation based on a number of times the suspend operation is performed during the erase operation.

21. A method of operating a memory device, the method comprising:

performing an erase operation on a memory block including a plurality of memory cells;

performing a suspend operation of suspending the erase operation in response to a suspend command received during the erase operation;

detecting a temperature during the suspend operation and setting at least one of an erase voltage, a word line voltage, or a select line voltage to be used during a resume operation based on the detected temperature; and performing the resume operation of resuming the suspended erase operation, wherein the erase operation is resumed using at least one of the set erase voltage, the set word line voltage, or the set select line voltage; and when the detected temperature is equal to or higher than a first temperature, setting the erase voltage for the erase operation to be resumed by decreasing a level of the erase voltage from a first reference value, setting the word line voltage by increasing a level of the word line voltage from a second reference value, and setting the select line voltage by decreasing a level of the select line voltage from a third reference value.

22. The method according to claim 21, further comprising when the detected temperature is lower than or equal to a second temperature lower than the first temperature, setting the erase voltage for the erase operation to be resumed by increasing the level of the erase voltage from the first reference value, setting the word line voltage by decreasing the level of the word line voltage from the second reference value, and setting the select line voltage by increasing the level of the select line voltage from the third reference value.

23. The method according to claim 21, further comprising setting at least one of the erase voltage, the word line voltage, or the select line voltage to be used during the resume operation based on the level of the erase voltage used in the suspended erase operation.

24. The method according to claim 21, further comprising setting at least one of the erase voltage, the word line voltage, or the select line voltage to be used during the resume operation based on a time point at which the suspend operation is performed during the erase operation.

25. The method according to claim 21, further comprising setting at least one of the erase voltage, the word line voltage, or the select line voltage to be used during the resume operation based on a number of times the suspend operation is performed during the erase operation.

26. A method of operating a memory device, the method comprising:

performing an erase operation on a memory block including a plurality of memory cells;

performing a suspend operation of suspending the erase operation in response to a suspend command received during the erase operation;

performing a first set operation setting at least one of an erase voltage, a word line voltage, or a select line voltage to be used during a resume operation based on a number of times the suspend operation is performed during the erase operation;

performing the resume operation of resuming the suspended erase operation, wherein the erase operation is resumed using at least one of the set erase voltage, the set word line voltage, or the set select line voltage; and setting a number of remaining erase pulse application loops by calculating a number of erase pulse application loops that are suspended due to the suspend operation and are not yet performed before the resume operation is performed.

27. The method according to claim 26, further comprising setting the number of remaining erase pulse application loops by decreasing or increasing the number of remaining erase pulse application loops based on the number of times the suspend operation is performed.

28. The method according to claim 26, further comprising adjusting a maximum allowable number of suspend operations performed during the erase operation based on the number of times the suspend operation is performed.

* * * * *